(12) United States Patent
Lin

(10) Patent No.: US 9,347,712 B2
(45) Date of Patent: May 24, 2016

(54) HEAT DISSIPATING DEVICE

(71) Applicant: COOLER MASTER DEVELOPMENT CORPORATION, New Taipei (TW)

(72) Inventor: Chia-Yu Lin, New Taipei (TW)

(73) Assignee: COOLER MASTER DEVELOPMENT CORPORATION, Zhonghe Dist., New Taipei (TW)

( * ) Notice: Subject to any disclaimer, the term of this patent is extended or adjusted under 35 U.S.C. 154(b) by 444 days.

(21) Appl. No.: 14/070,587

(22) Filed: Nov. 4, 2013

(65) Prior Publication Data
US 2014/0131014 A1    May 15, 2014

(30) Foreign Application Priority Data
Nov. 14, 2012    (TW) .............................. 101222032 U

(51) Int. Cl.
*F28D 15/00*    (2006.01)
*F28D 15/02*    (2006.01)
*H01L 23/427*    (2006.01)

(52) U.S. Cl.
CPC ............ *F28D 15/0275* (2013.01); *F28D 15/02* (2013.01); *H01L 23/427* (2013.01)

(58) Field of Classification Search
CPC ....... F28D 15/0275; H01L 23/427; F28F 1/10
USPC ........................................ 165/104.26, 104.33
See application file for complete search history.

(56) References Cited

U.S. PATENT DOCUMENTS

| | | | | |
|---|---|---|---|---|
| 2,663,551 A | * | 12/1953 | Boling ................... | F25D 31/002 164/108 |
| 5,229,915 A | * | 7/1993 | Ishibashi ............... | H01L 23/427 165/104.33 |
| 6,166,907 A | * | 12/2000 | Chien .................... | F28D 1/0478 165/104.33 |
| 6,408,934 B1 | * | 6/2002 | Ishida .................. | F28D 15/0233 165/104.33 |
| 7,333,332 B2 | * | 2/2008 | Wang ..................... | H01L 23/427 165/121 |
| 7,518,861 B2 | * | 4/2009 | Lev ......................... | G06F 1/203 165/104.33 |
| 7,770,633 B2 | * | 8/2010 | Miyahara ............ | F28D 15/0233 165/128 |
| 7,839,630 B2 | * | 11/2010 | Hwang ................... | G06F 1/203 165/104.33 |
| 7,852,631 B2 | * | 12/2010 | Yu ......................... | H01L 23/427 165/104.33 |

(Continued)

*Primary Examiner* — Marc Norman
*Assistant Examiner* — Devon Russell
(74) *Attorney, Agent, or Firm* — Winston Hsu; Scott Margo

(57) ABSTRACT

A heat dissipating device includes a heat dissipating fin module, a second base, a third base, a heat pipe, a first sleeve and a fourth base. The heat dissipating fin module includes a first base and a plurality of first heat dissipating fins. A recess is formed on the second base. The third base is disposed in the recess. The heat pipe includes a heat dissipating segment, a heat absorbing segment and a connecting segment connecting the heat dissipating segment and the heat absorbing segment. The heat dissipating segment is disposed in the first base. The heat absorbing segment is disposed in the second and third bases and contacts the third base directly. The first sleeve at least covers the connecting segment. The fourth base is formed by a die casting process and covers peripheries of the first and second bases and the first sleeve.

7 Claims, 4 Drawing Sheets

(56) References Cited

U.S. PATENT DOCUMENTS

| | | | | |
|---|---|---|---|---|
| 7,881,060 B2 * | 2/2011 | Chung | F28D 15/0233 | 165/104.21 |
| 8,934,248 B2 * | 1/2015 | Thrailkill | F21S 48/328 | 361/679.54 |
| 2001/0047590 A1 * | 12/2001 | McCullough | B23P 15/26 | 29/890.032 |
| 2002/0096313 A1 * | 7/2002 | Graf | F28F 1/32 | 165/104.33 |
| 2003/0121645 A1 * | 7/2003 | Wang | F28D 15/0233 | 165/104.26 |
| 2004/0040696 A1 * | 3/2004 | Cho | F28D 15/0233 | 165/104.26 |
| 2004/0177947 A1 * | 9/2004 | Krassowski | F28F 3/048 | 165/104.33 |
| 2006/0144567 A1 * | 7/2006 | Zhu | F28D 15/0275 | 165/104.29 |
| 2007/0253769 A1 * | 11/2007 | Hwang | H01L 23/4093 | 403/326 |
| 2008/0121371 A1 * | 5/2008 | Zhou | F28D 15/0275 | 165/80.3 |
| 2009/0000768 A1 * | 1/2009 | Zheng | F28D 15/0275 | 165/80.3 |
| 2009/0038782 A1 * | 2/2009 | Chen | F28D 15/0275 | 165/104.33 |
| 2010/0212869 A1 * | 8/2010 | Liu | H01L 23/367 | 165/104.26 |
| 2010/0319883 A1 * | 12/2010 | Facusse | H05K 7/20809 | 165/104.26 |
| 2012/0205084 A1 * | 8/2012 | Huang | G06F 1/203 | 165/181 |

\* cited by examiner

HEAT DISSIPATING DEVICE

BACKGROUND OF THE INVENTION

1. Field of the Invention

The invention relates to a heat dissipating device and, more particularly, to a heat dissipating device capable of enhancing heat dissipating efficiency effectively.

2. Description of the Prior Art

Heat dissipating device is a significant component for electronic products. When an electronic product is operating, the current in circuit will generate unnecessary heat due to impedance. If the heat is accumulated in the electronic components of the electronic product without dissipating immediately, the electronic components may get damage due to the accumulated heat. Therefore, the performance of heat dissipating device is a significant issue for the electronic product. How to enhance heat dissipating efficiency of the heat dissipating device effectively has become a significant design issue.

SUMMARY OF THE INVENTION

The invention provides a heat dissipating device capable of enhancing heat dissipating efficiency effectively.

According to an embodiment of the invention, a heat dissipating device comprises a heat dissipating fin module, a second base, a third base, a heat pipe, a first sleeve and a fourth base. The heat dissipating fin module is made of a first heat conducting material. The heat dissipating fin module comprises a first base and a plurality of first heat dissipating fins, wherein the first heat dissipating fins extends from a side of the first base. The second base is made of the first heat conducting material and a recess is formed on the second base. The third base is made of a second heat conducting material. The third base is disposed in the recess and a surface of the third base being exposed, wherein a thermal conductivity of the second heat conducting material is greater than a thermal conductivity of the first heat conducting material. The heat pipe comprises a heat dissipating segment, a heat absorbing segment and a connecting segment, wherein the connecting segment connects the heat dissipating segment and the heat absorbing segment, the heat dissipating segment is disposed in the first base, the heat absorbing segment is disposed in the second base and the third base, and the heat absorbing segment contacts the third base directly. The first sleeve is made of the first heat conducting material and at least covers the connecting segment. The fourth base is formed by the first heat conducting material, which is melted, in a die casting process and covers peripheries of the first and second bases and the first sleeve.

As mentioned in the above, after forming the heat dissipating device, the heat absorbing segment of the heat pipe directly contacts the third base with great thermal conductivity and a surface of the third base is exposed. Accordingly, the exposed surface of the third base of the heat dissipating device can be attached to an electronic component, such that heat generated by the electronic component can be conducted to the heat absorbing segment of the heat pipe directly through the third base, so as to enhance heat dissipating efficiency effectively. Furthermore, the invention uses copper with great thermal conductivity to form the third base and uses aluminum with small thermal conductivity to form the second base and the fourth base. Since the fourth base only covers the periphery of the second base and does not contact the third base, the second base can prevent copper from melting and being mixed with the melted aluminum during the die casting process, so as to avoid increasing copper in the melted aluminum during the die casting process. Therefore, when the heat dissipating device of the invention is installed outside, the fourth base will not crack due to corrosion since the fourth base is formed by the die casting process. Consequently, the lifetime of the heat dissipating device of the invention can be extended effectively. Moreover, since the connecting segment of the heat pipe is covered by the sleeve, it not only can enhance the connecting strength between the heat pipe and the fourth base but also can prevent the heat pipe from cracking during the die casting process.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
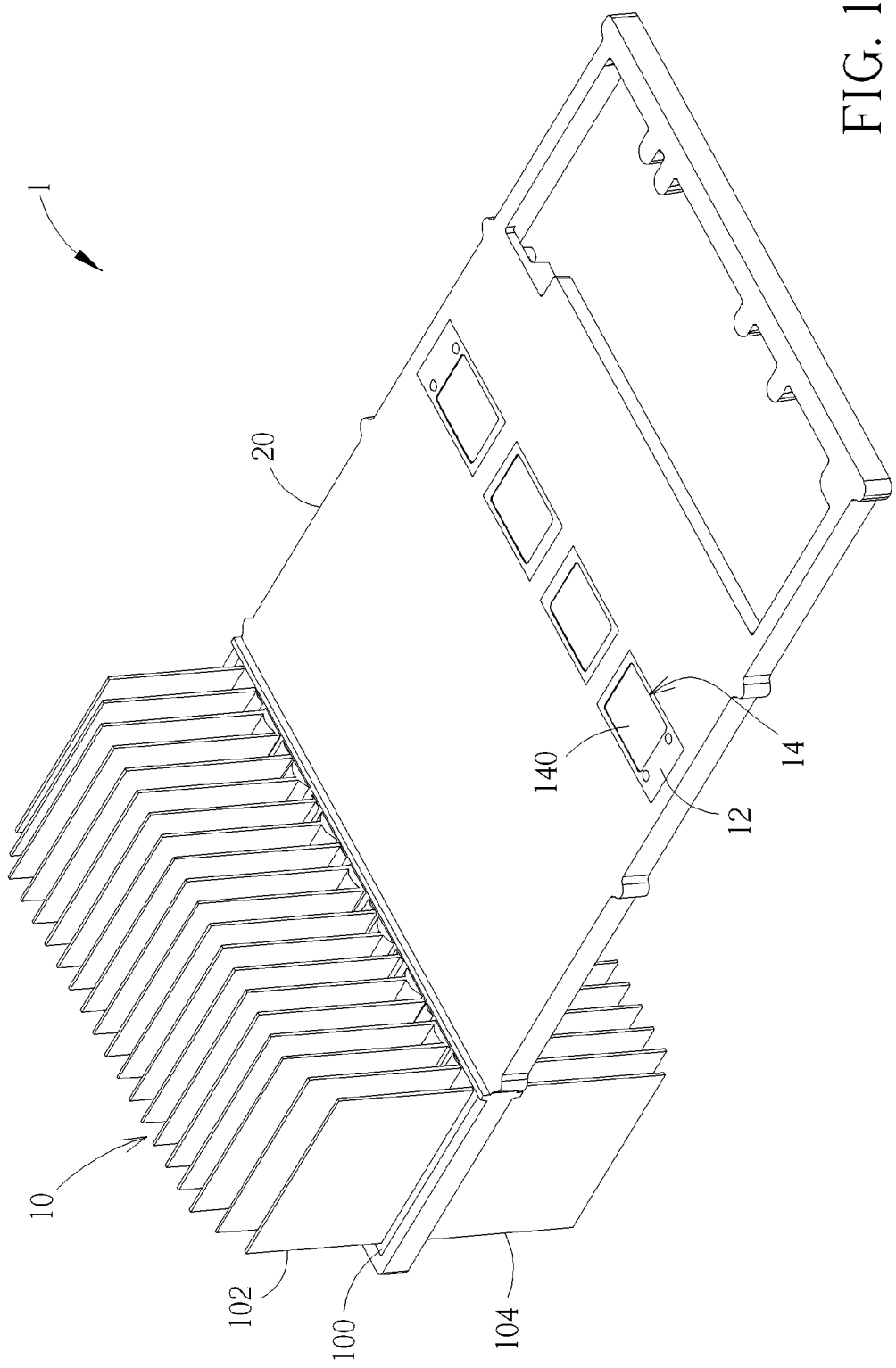
FIG. 1 is a schematic view illustrating a heat dissipating device according to a first embodiment of the invention.
Figure 2:
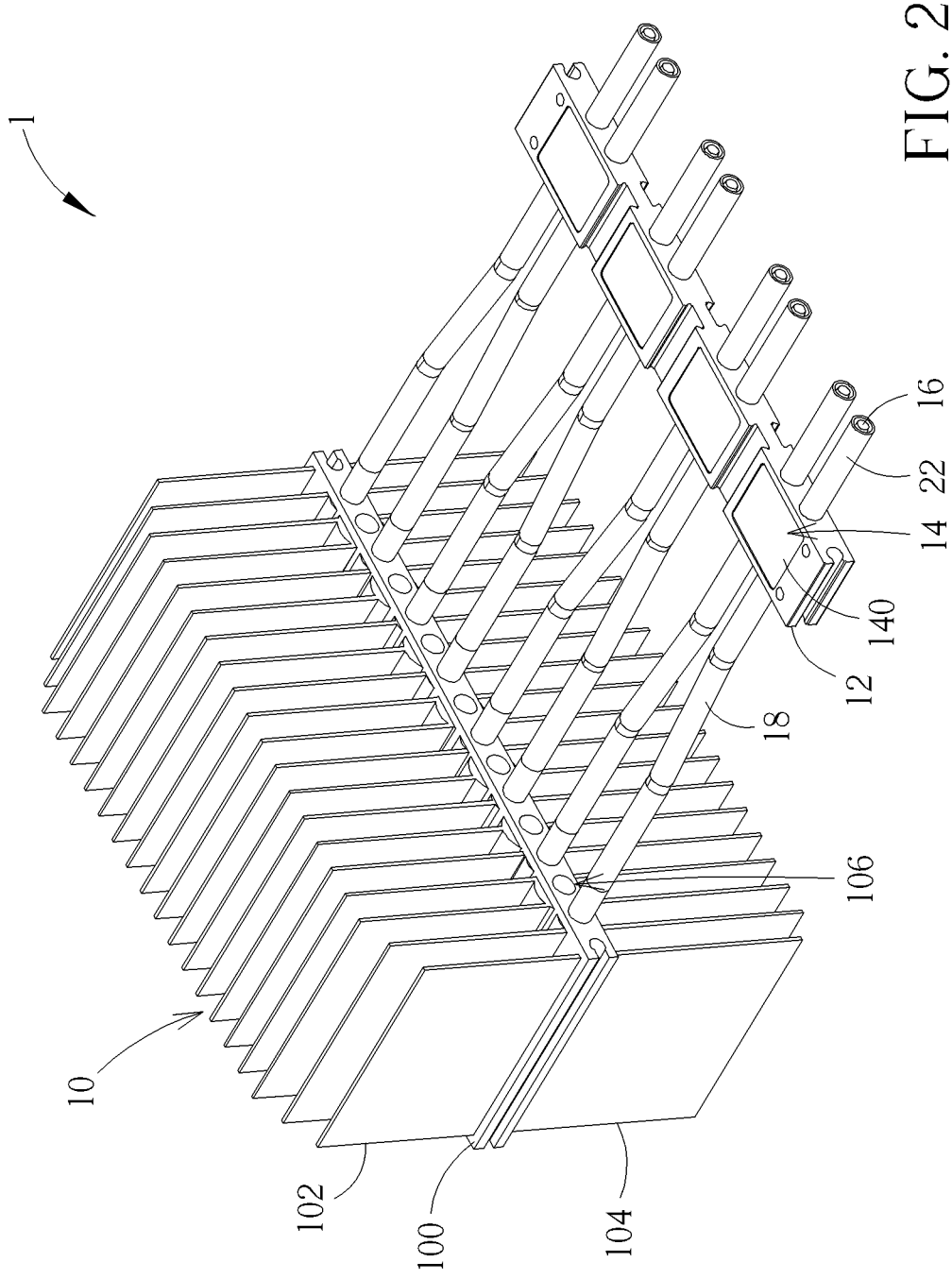
FIG. 2 is a schematic view illustrating the heat dissipating device shown in FIG. 1 without the fourth base.
Figure 3:
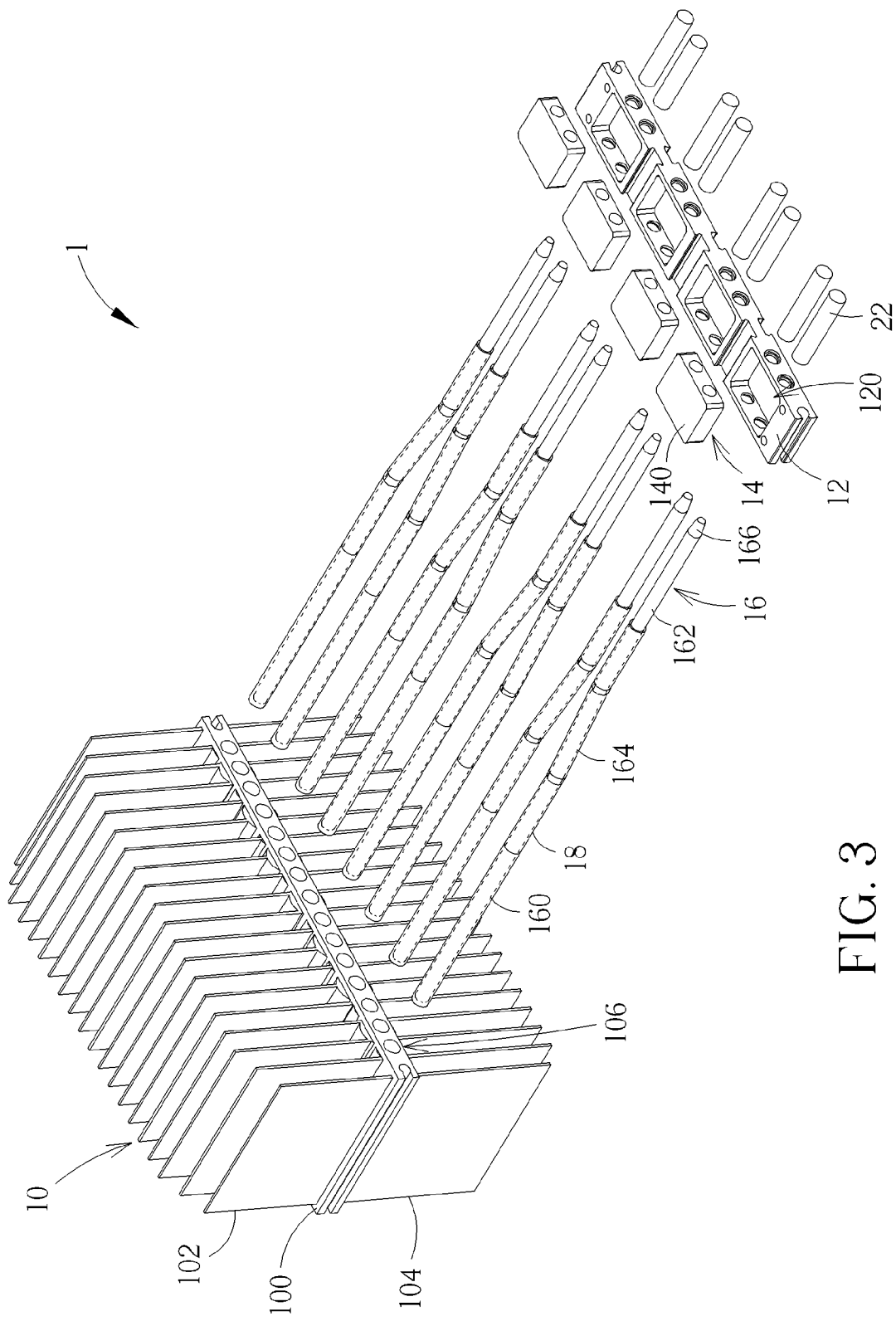
FIG. 3 is an exploded view illustrating the heat dissipating device shown in FIG. 2.

Referring to FIGS. 1 to 3, FIG. 1 is a schematic view illustrating a heat dissipating device 1 according to a first embodiment of the invention, FIG. 2 is a schematic view illustrating the heat dissipating device 1 shown in FIG. 1 without the fourth base 20, and FIG. 3 is an exploded view illustrating the heat dissipating device 1 shown in FIG. 2. As shown in FIGS. 1 to 3, the heat dissipating device 1 comprises a heat dissipating fin module 10, a second base 12, a third base 14, a heat pipe 16, a first sleeve 18, a fourth base 20 and a second sleeve 22. It should be noted that the number of the third bases 14, the heat pipes 16, the first sleeves 18 and the second sleeves 22 can be determined based on practical applications, so those are not limited in the embodiment shown in FIGS. 1 to 3.

The heat dissipating fin module 10 is made of a first heat conducting material. The heat dissipating fin module 10 comprises a first base 100, a plurality of first heat dissipating fins 102 and a plurality of second heat dissipating fins 104, wherein the first heat dissipating fins 102 and the second heat dissipating fins 104 extend from opposite sides of the first base 100, and a plurality of holes 106 is formed on the first base 100. The second base 12 is also made of the first heat conducting material and a recess 120 is formed on the second base 12. In this embodiment, the first heat conducting material may be aluminum, and the heat dissipating fin module 10 and the second base 12 may be formed by an aluminum extrusion process.

The third base 14 is made of a second heat conducting material. The third base 14 is disposed in the recess 120 of the second base 12 and a surface 140 of the third base 14 is exposed, wherein a thermal conductivity of the second heat conducting material is greater than a thermal conductivity of the first heat conducting material. In other words, the third base 14 with great thermal conductivity is located at the center of the second base 12 with small thermal conductivity. In this embodiment, the third base 14 may be disposed in the recess 120 of the second base 12 in a tight-fitting manner and the second heat conducting material may be copper.

In general, the heat pipe 16 may essentially consist of a hollow casing, a capillary structure formed in the hollow casing, and a work fluid filled in the hollow casing, wherein the hollow casing may be made of copper. In this embodiment, the heat pipe 16 comprises a heat dissipating segment 160, a heat absorbing segment 162, a connecting segment 164 and an extending segment 166, wherein the connecting segment 164 connects the heat dissipating segment 160 and the heat absorbing segment 162, and the extending segment 166 extends from the heat absorbing segment 162. The heat dissipating segment 160 is disposed in the first base 100 and the heat absorbing segment 162 is disposed in the second base 12 and the third base 14. The first sleeve 18 and the second sleeve 22 both are made of the first heat conducting material, wherein the first sleeve 18 at least covers the connecting segment 164 and the second sleeve 22 covers the extending segment 166. In this embodiment, the first sleeve 18 covers the connecting segment 164 and the heat dissipating segment 160. In another embodiment, the first sleeve 18 may only cover the connecting segment 164 and it depends on practical applications. Furthermore, the extending segment 166 of the heat pipe 16 and the second sleeve 22 may also be removed from the heat dissipating device 1 according to practical applications.

The fourth base 20 is formed by the first heat conducting material, which is melted, in a die casting process and covers peripheries of the first and second bases 100, 12 and the first sleeve 22.

To manufacture the heat dissipating device 1 of the invention, the third base 14 is disposed in the recess 120 of the second base 12 first and then the first sleeve 18 is sleeved on the connecting segment 164 and the heat dissipating segment 160 of the heat pipe 16. Afterward, the heat dissipating segment 160 of the heat pipe 16 is inserted into the first base 100 and the extending segment 166 of the heat pipe 16 is inserted through the second base 12 and the third base 14, such that the heat absorbing segment 162 of the heat pipe 16 is disposed in the second base 12 and the third base 14. Since the heat absorbing segment 162 of the heat pipe 16 is naked, the heat absorbing segment 162 of the heat pipe 16 contacts the third base 14 directly. Then, the second sleeve 22 is sleeved on the extending segment 166 of the heat pipe 16. Then, the assembly of the heat dissipating fin module 10, the second base 12, the third base 14, the heat pipe 16, the first sleeve 18 and the second sleeve 20 is placed into a mold (not shown), wherein the mold can be designed according to the desired appearance of the fourth base 20. Then, the melted first heat conducting material (e.g. aluminum) is poured into the mold. Finally, the fourth base 20 is formed by the first heat conducting material in a die casting process, such that the fourth base 20 covers the periphery of the first base 100, the periphery of the second base 12, the first sleeve 18 and the second sleeve 22, wherein the surface 140 of the third base 14 is exposed. During the die casting process, the melted first heat conducting material will flow into the holes 106 of the first base 100, such that parts of the fourth base 20 are engaged in the holes 106 after the die casting process, so as to enhance the connecting strength between the fourth base 20 and the first base 100.

After forming the heat dissipating device 1, the heat absorbing segment 162 of the heat pipe 16 directly contacts the third base 14 with great thermal conductivity and the surface 140 of the third base 14 is exposed. Accordingly, the exposed surface 140 of the third base 14 of the heat dissipating device 1 can be attached to an electronic component (not shown), such that heat generated by the electronic component can be conducted to the heat absorbing segment 162 of the heat pipe 16 directly through the third base 14, so as to enhance heat dissipating efficiency effectively. Furthermore, the invention uses copper with great thermal conductivity to form the third base 14 and uses aluminum with small thermal conductivity to form the second base 12 and the fourth base 20. Since the fourth base 20 only covers the periphery of the second base 12 and does not contact the third base 14, the second base 12 can prevent copper from melting and being mixed with the melted aluminum during the die casting process, so as to avoid increasing copper in the melted aluminum during the die casting process. Therefore, when the heat dissipating device 1 of the invention is installed outside, the fourth base 20 will not crack due to corrosion since the fourth base 20 is formed by the die casting process. Consequently, the lifetime of the heat dissipating device 1 of the invention can be extended effectively. Moreover, since the connecting segment 164 and the extending segment 166 of the heat pipe 16 are covered by the first sleeve 18 and the second sleeve 22, respectively, it not only can enhance the connecting strength between the heat pipe 16 and the fourth base 20 but also can prevent the heat pipe 16 from cracking during the die casting process.

Figure 4:
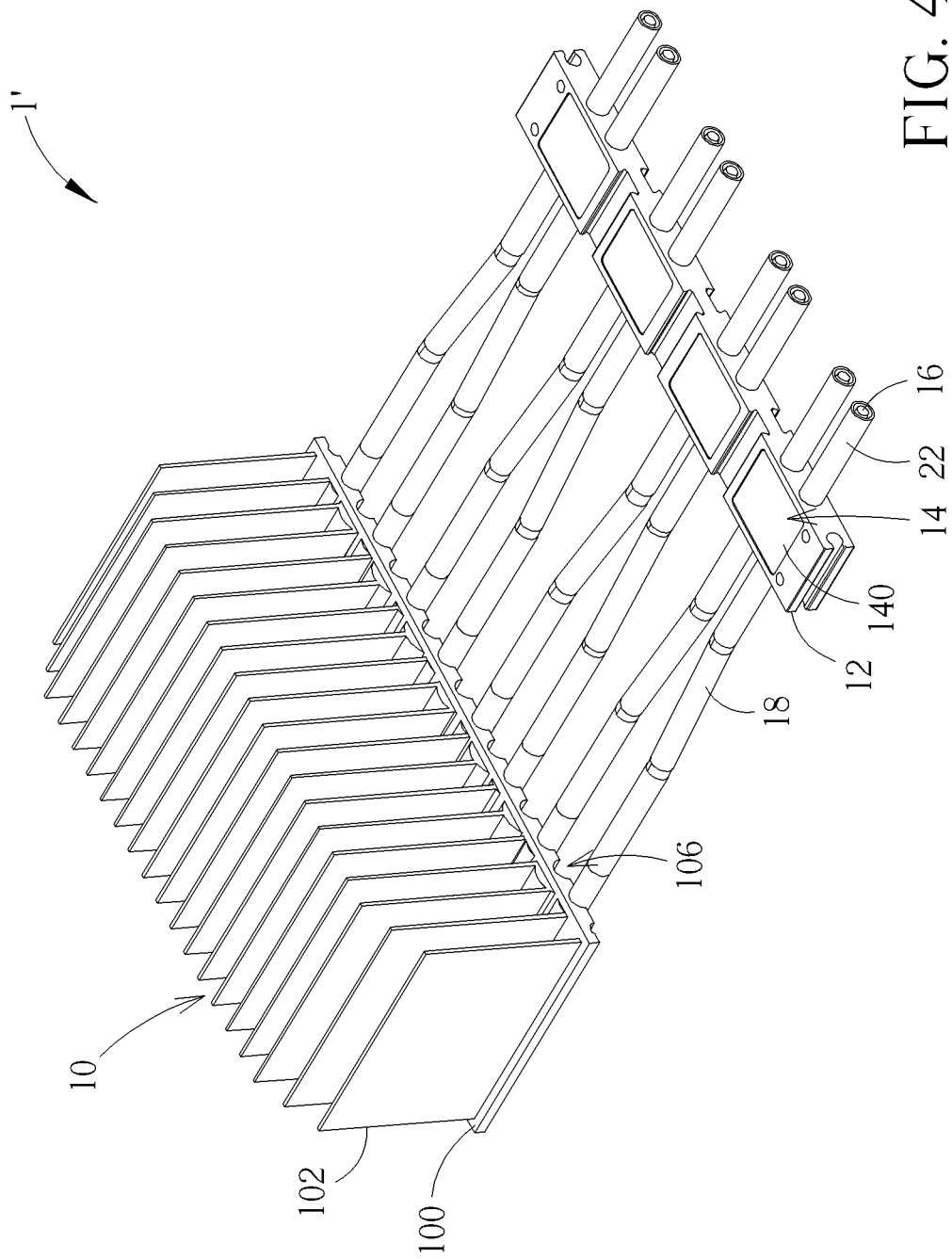
FIG. 4 is a schematic view illustrating a heat dissipating device according to a second embodiment of the invention.

Referring to FIG. 4 along with FIG. 2, FIG. 4 is a schematic view illustrating a heat dissipating device 1' according to a second embodiment of the invention. The difference between the heat dissipating device 1' and the aforesaid heat dissipating device 1 is that the heat dissipating fin module 10 of the heat dissipating device 1' does not comprise the aforesaid second heat dissipating fins 104, and the holes 106 formed on the first base 100 are half circular in shape. As shown in FIG. 4, the first heat dissipating fins 102 extend from a side of the first base 100 and the heat dissipating segment 160 of the heat pipe 16 is embedded in the half circular holes 106. In practical applications, the heat dissipating segment 160 of the heat pipe 16 may be punched to form a flat bottom, so as to enable the flat bottom of the heat dissipating segment 160 to be coplanar with the bottom of the first base 100. Furthermore, the fourth base 20 may also be formed by the aforesaid die casting process, so it will not be depicted herein again. Moreover, an engaging structure (e.g. hook) may be formed in the half circular holes 106, so as to enhance the connecting strength between the first base 100 and the fourth base 20. It should be noted that the same elements in FIG. 4 and FIGS. 1 to 3 are represented by the same numerals, so the repeated explanation will not be depicted herein again.

As mentioned in the above, after forming the heat dissipating device, the heat absorbing segment of the heat pipe directly contacts the third base with great thermal conductivity and a surface of the third base is exposed. Accordingly, the exposed surface of the third base of the heat dissipating device can be attached to an electronic component, such that heat generated by the electronic component can be conducted to the heat absorbing segment of the heat pipe directly through the third base, so as to enhance heat dissipating efficiency effectively. Furthermore, the invention uses copper with great thermal conductivity to form the third base and uses aluminum with small thermal conductivity to form the second base and the fourth base. Since the fourth base only covers the periphery of the second base and does not contact the third base, the second base can prevent copper from melting and being mixed with the melted aluminum during the die casting process, so as to avoid increasing copper in the melted aluminum during the die casting process. Therefore, when the heat dissipating device of the invention is installed outside, the fourth base will not crack due to corrosion since the fourth base is formed by the die casting process. Consequently, the lifetime of the heat dissipating device of the invention can be extended effectively. Moreover, since the connecting segment of the heat pipe is covered by the sleeve, it not only can enhance the connecting strength between the heat pipe and the fourth base but also can prevent the heat pipe from cracking during the die casting process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating device comprising:
   a heat dissipating fin module made of a first heat conducting material, the heat dissipating fin module comprising a first base and a plurality of first heat dissipating fins, the first heat dissipating fins extending from a side of the first base;
   a second base made of the first heat conducting material, a recess being formed on the second base;
   a third base made of a second heat conducting material, the third base being disposed in the recess, a surface of the third base being exposed, a thermal conductivity of the second heat conducting material being greater than a thermal conductivity of the first heat conducting material;
   a heat pipe comprising a heat dissipating segment, a heat absorbing segment and a connecting segment, the connecting segment connecting the heat dissipating segment and the heat absorbing segment, the heat dissipating segment being disposed in the first base, the heat absorbing segment being disposed in the second base and the third base, the heat absorbing segment contacting the third base directly;
   a first sleeve made of the first heat conducting material, the first sleeve at least covering the connecting segment; and
   a fourth base formed by the first heat conducting material, which is melted, in a die casting process and covering peripheries of the first and second bases and the first sleeve.

2. The heat dissipating device of claim 1, wherein the first heat conducting material is aluminum and the second heat conducting material is copper.

3. The heat dissipating device of claim 1, wherein the first sleeve covers the connecting segment and the heat dissipating segment.

4. The heat dissipating device of claim 1, wherein the heat dissipating fin module further comprises a plurality of second heat dissipating fins, the first heat dissipating fins and the second heat dissipating fins extend from opposite sides of the first base.

5. The heat dissipating device of claim 1, wherein a plurality of holes is formed on the first base, parts of the fourth base are engaged in the holes after the die casting process.

6. The heat dissipating device of claim 1, wherein the heat pipe further comprises an extending segment extending from the heat absorbing segment, the heat dissipating device further comprises a second sleeve made of the first heat conducting material, the second sleeve covers the extending segment, and the fourth base further covers the second sleeve.

7. The heat dissipating device of claim 1, wherein the third base is disposed in the recess in a tight-fitting manner.

* * * * *